(12) United States Patent
Chen et al.

(10) Patent No.: US 10,470,333 B2
(45) Date of Patent: Nov. 5, 2019

(54) FLEXIBLE CHASSIS FOR DIFFERENT SIZED SLEDS

(71) Applicant: QUANTA COMPUTER INC., Taoyuan (TW)

(72) Inventors: Chao-Jung Chen, Taoyuan (TW); Chih-Wei Lin, Taoyuan (TW); Ming-Lun Ku, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 0 days.

(21) Appl. No.: 15/972,810

(22) Filed: May 7, 2018

(65) Prior Publication Data

US 2019/0215979 A1 Jul. 11, 2019

Related U.S. Application Data

(60) Provisional application No. 62/613,871, filed on Jan. 5, 2018.

(51) Int. Cl.
*H05K 7/14* (2006.01)
*H05K 7/18* (2006.01)

(52) U.S. Cl.
CPC ......... *H05K 7/1489* (2013.01); *H05K 7/1492* (2013.01); *H05K 7/183* (2013.01)

(58) Field of Classification Search
CPC .... H05K 7/183; H05K 7/1489; H05K 7/1457; H05K 7/1492
See application file for complete search history.

(56) References Cited

U.S. PATENT DOCUMENTS

| | | | |
|---|---|---|---|
| 4,555,744 A | 11/1985 | Maroney et al. | |
| 6,422,399 B1 | 7/2002 | Castillo et al. | |
| 7,134,558 B1 | 11/2006 | Mimlitch, III et al. | |
| 9,232,678 B2 * | 1/2016 | Bailey | H05K 7/1489 |
| 9,247,667 B2 * | 1/2016 | Sato | H05K 7/1421 |
| 2005/0087503 A1 | 4/2005 | Zuclich et al. | |
| 2010/0200716 A1 | 8/2010 | White, III | |
| 2011/0149508 A1 | 6/2011 | Malekmadani | |
| 2012/0111817 A1 * | 5/2012 | Sweeny | H05K 7/1489 211/133.6 |
| 2017/0168975 A1 * | 6/2017 | Heinrichs | G06F 13/409 |
| 2017/0300100 A1 * | 10/2017 | Takeuchi | G06F 1/266 |

OTHER PUBLICATIONS

Extended European Search Report for EP Application No. 18206223.2, dated May 21, 2019.

* cited by examiner

*Primary Examiner* — Mukundbhai G Patel
(74) *Attorney, Agent, or Firm* — Nixon Peabody LLP; Zhou Lu

(57) ABSTRACT

An adaptable rack chassis for accommodating electronic component sleds of differing widths and heights is disclosed. One example chassis includes side walls and a back wall with registration features at different heights. Shelves may be attached to the registration features at different heights. The front end of the side walls may be attached to shelves at different heights. Another example chassis may have an adaptable horizontal bus bar structure that is located to the back of two side walls. Another example chassis may have vertical bus bar structure that may be adjusted over the width between side walls.

20 Claims, 16 Drawing Sheets

FLEXIBLE CHASSIS FOR DIFFERENT SIZED SLEDS

PRIORITY CLAIM

This application claims priority to U.S. Provisional Application No. 62/613,871, filed on Jan. 5, 2018. The contents of that application are hereby incorporated by reference in their entirety.

TECHNICAL FIELD

The present disclosure relates generally to a flexible rack structure. More particularly, aspects of this disclosure relate to a rack structure that may be adapted to accommodate a multiple number of different sized sleds.

BACKGROUND

The emergence of the cloud for computing applications has increased the demand for off-site installations, known as data centers, that store data and run applications accessed by remotely connected computer device users. Such data centers typically have massive numbers of devices such as servers, switches and storage devices to store and manage data, and so they may be accessed in a convenient manner by remote computer users. A typical data center has physical rack or chassis structures with attendant power and communication connections. Such racks may hold multiple network devices, that may be swapped in and out of the rack. The racks are arranged in rows throughout the room or rooms of the data center. Each rack includes a frame that has horizontally oriented slots that may hold multiple devices such as servers, switches, and storage devices. There are many such devices stacked in such rack structures found in a modern data center. For example, some data centers have tens of thousands of servers, and attendant storage devices, and network switches. Thus, a typical data center may include tens of thousands, or even hundreds of thousands, of devices in hundreds or thousands of individual racks.

A typical rack includes a chassis that has side walls joined by a bottom wall and a top wall. The rack may also include various electronic components that may be used to support devices that are installed in the rack. For example, a rack system may include a power distribution board that includes power supply units to supply power to the devices in the rack. Each of the side walls has multiple registration features, such as a groove or a tab that are periodically spaced apart. Multiple shelves are installed between the side walls on the registration features. Once installed, each shelf may hold different network devices. The rack system typically has a fixed height that separates each shelf. Different network devices such as servers, switches, routers or the like are carried in removable sled structures, that may be inserted on one of the shelves in the rack. The size of typical sled components is based in standard height units. For example, height may be expressed in terms of "U", and therefore a standard 1 U rack-mount server is 1.75 inches high, while a 2 U server measures three inches in height. Typical network devices may be designed with different standard units of height.

Currently, most racks have slots created by the shelves that have the same height because the registration features are set in the side walls. This arrangement works well when the network components in the rack are the same or have identical sizes, but also restricts the inner space of the rack to sleds of one size. However, since network components and their corresponding sleds often have different sizes (e.g., different widths and heights), different chassis designs must be used for different components, thereby increasing expense and complexity. Therefore, in order to accommodate different height devices in one chassis, the chassis structure must be replaced to provide the proper space.

A typical chassis also includes a vertical bus bar. The bus bar is a fixed structure that allows power cables to be connected from a power supply to the inserted sleds. The position of the bus bar is determined by the pitch of the sled. In current chassis designs, the bus bar prevents freely changing the quantity of the sleds in the same slot because the number of power connections is limited.

Thus, there is a need for an adaptable chassis that can be easily adjusted to accommodate different sleds having different heights. There is also a need for a chassis that allows the adjustment of the position of bus bars to allow different quantities of sleds to be inserted. There is a further need for an adaptable chassis that allows ready adjustment of support structures to accommodate a changing variety of different sized sleds.

SUMMARY

One disclosed example is an adaptable chassis having a pair of side walls, with each of the side walls having a flange on a front end and an opposite rear end. A back wall is attached to the rear ends of the side walls. The back wall includes a plurality of registration features at different heights. A shelf having a front end and a back end is provided. The back end includes an engagement feature that engages one of the plurality of registration features at a desired height. The front end includes a tab for contacting the flange of one of the side walls.

Another example is an adaptable chassis that includes a pair of side walls and a bottom plate joining the side walls. A first shelf is inserted between the side walls. A bus bar structure is located on one end of the side walls. The bus bar structure includes a vertical support holding a first horizontal bus bar plate at approximately the same height as the first shelf.

Another example is an adaptable chassis that includes a pair of side walls each having a front end and a rear end. A bottom plate joins the side walls between the front end and the rear end of the side walls. A first shelf is inserted between the side walls from the front ends of the side walls. A first bus bar structure is located near the rear ends of the side walls. The first bus bar structure includes a horizontal anchoring support and a vertical support. The first bus bar structure is adjustably positioned between the side walls.

Another example is an adaptable chassis that includes a front chassis structure having a pair of side walls. A first shelf is insertable between the side walls of the front chassis. A rear chassis structure having a pair of side walls and an open front end to receive the front chassis is provided. A bus bar structure is located at an opposite rear end of the rear chassis structure.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which.

Figure 1:
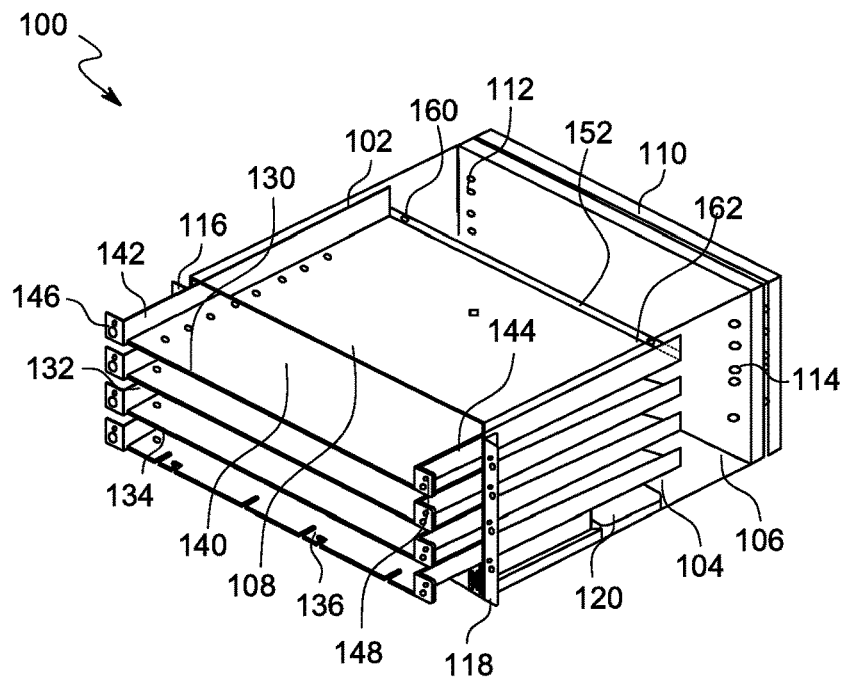
FIG. 1 is an exploded perspective view of an example adaptable chassis with four shelves to allow 1 U height components to be installed.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements, and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2:
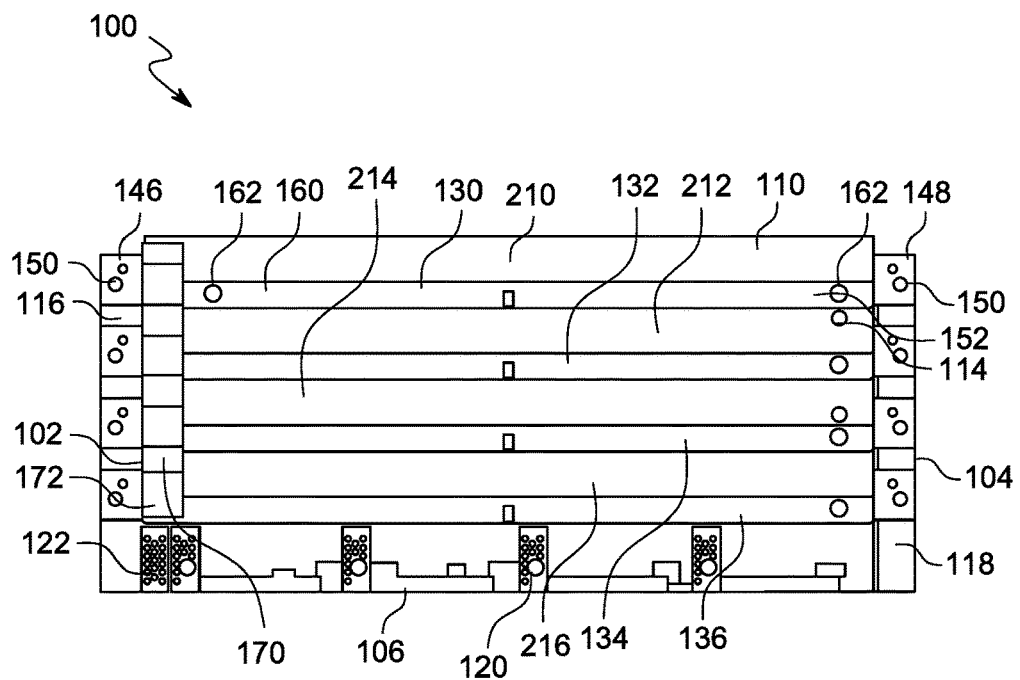
FIG. 2 is a front view of the example adaptable chassis in FIG. 1 having four shelves installed to allow 1 U height components to be installed.

FIG. 1 is a perspective front view of an adaptable chassis 100, and FIG. 2 is a front view of the chassis 100. The chassis 100 includes two side walls 102 and 104. The side walls 102 and 104 are supported by a bottom plate 106. The side walls 102 and 104 are joined by a top plate 108. A back wall 110 is joined to the two side walls 102 and 104, and forms the back of the chassis 100. The interior surface of the back wall 110 includes registration features such as two parallel rows of guide pins 112 and 114. The registration features are used to hold shelves at different levels between the side walls 102 and 104. The side walls 102 and 104 have respective front flanges 116 and 118 that project perpendicularly from the side walls 102 and 104.

In this example, the bottom plate 106 includes various electronic support components on a power distribution board 120. For example, the electronic components on the power distribution board 120 may include a chassis management controller (CMC) 122. Other components may include power supplies, bus interfaces, network interfaces, etc. In this example, the configuration of the interior space of the chassis 100 is adjustable by installing shelves between the side walls 102 and 104. This flexibility allowing accommodation of different height sleds improves the utilization of the interior space of the chassis 100.

In this example, as shown in FIGS. 1-2, the chassis 100 has four shelves 130, 132, 134 and 136 installed. Each of the shelves, such as the shelf 130, includes a horizontal tray 140 with two side rails 142 and 144. The tray 140 is generally flat and is designed to hold one or more electronic component sleds. The front ends of the side rails 142 and 144 include a pair of respective front tabs 146 and 148. The front tabs 146 and 148 each include a guide hole 150 drilled therethrough. Each of the front flanges 116 and 118 have holes set at different heights. The front tabs 146 and 148 are positioned to contact the respective flanges 116 and 118 when the shelf 140 is inserted between the side walls 102 and 104. Thus, as will be explained below an attachment mechanism can be inserted in the holes 150 of the front tabs 146 and 148 of the tray 140 and corresponding holes at a desired height on the flanges 116 and 118 of the side walls 102 and 104.

The opposite rear side of the side rails 142 and 144 of the tray 140 are attached to a rear flange 152. The rear flange 152 has two guide holes 160 and 162 drilled therethrough. The horizontal position of each of the guide holes 160 and 162 is aligned with the rows of guide pins 112 and 114 on the back wall 110, respectively. A set of linking boards, such as a linking board 170, is fixed on the chassis 100. Each of the linking boards 170 are connected to the power distribution board 120 in the chassis 100. Each sled installed into the chassis 100 on the guide holes 160 and 162 contact to a linking board by a respective connector such as a connector 172. Thus, data signals from each sled could be send to the CMC 122. The CMC 122 may be connected to a management switch that allows monitoring of all of the sleds installed in the chassis 100.

Figure 3:
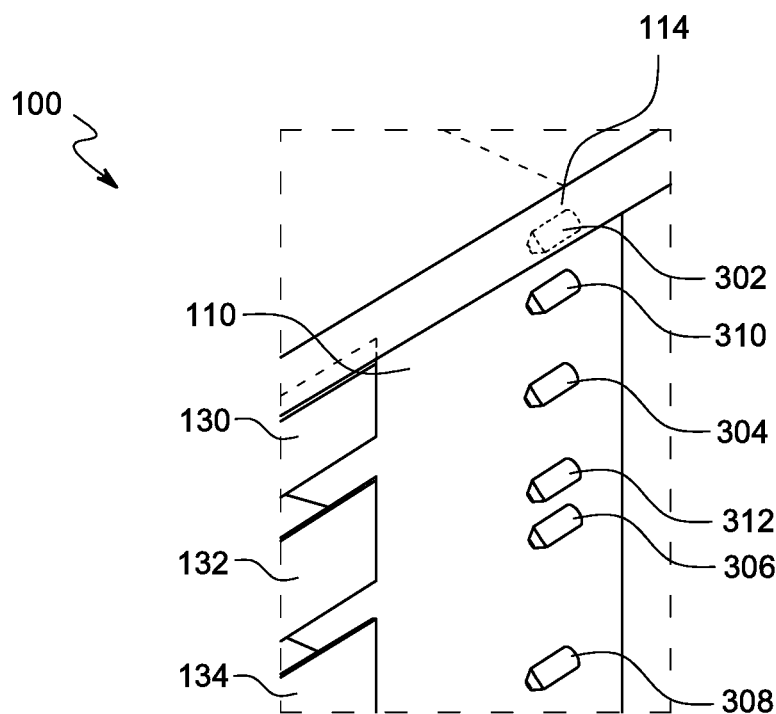
FIG. 3 is a close up perspective view of the back wall of the example chassis in FIG. 2 with guide pins at different heights.

FIG. 3 is a close up, perspective view of the back wall 110 and one of the rows of guide pins 114. The row of guide pins 114 include one set of guide pins 302, 304, 306 and 308 that are set approximately one standard height unit (U) apart vertically. As explained above, the guide pins 302, 304, 306 and 308 each fit within the guide hole 160 in a shelf such as the shelf 130. Similar guide pins of the row 112 fit within the guide hole 162 in a shelf such as the shelf 130. Thus, a shelf may be installed at different heights with the interior space of the chassis 100 by mating the respective guide holes with the desired guide pins in the rows 112 and 114 (in FIG. 1). The shelf is also secured by attaching the front flanges to the corresponding front flanges 116 and 118 of the side walls 102 and 104 of the chassis 100.

Since the guide pins 302, 304, 306 and 308 are one standard unit apart, either four shelves may be installed, allowing for four one-unit height components or two shelves may be installed on the guide pins 308 and 304 allowing the installation of two, two unit height components. Another set of guide pins 310 and 312 are installed at different height positions than the guide pins 302, 304, 306 and 308. In this example, the height is 1.33 standard units between the guide pin 308 and the guide pin 312. The height is also 1.33 standard units between the guide pin 312 and the guide pin 310.

Returning to FIG. 2, one of the guide holes such as the guide holes 162 of the rear flanges 152 of the shelves 130, 132, 134 and 136 are mated with the guide pins 302, 304, 306, and 308 on the back wall 110 in FIG. 3. The other guide hole of the rear ends, such as the guide hole 160, are mated with the corresponding guide pins on the row 112 (in FIG. 1) on the backwall 110. The front tabs of the respective shelves 130, 132, 134, and 136 are fastened at the respective heights to the front flanges of the side walls 102 and 104 respectively. After the shelves 130, 132, 134, and 136 are secured, sleds 210, 212, 214, and 216, each having a one standard unit height, are mounted on respective shelves 130, 132, 134, and 136.

Figure 4:
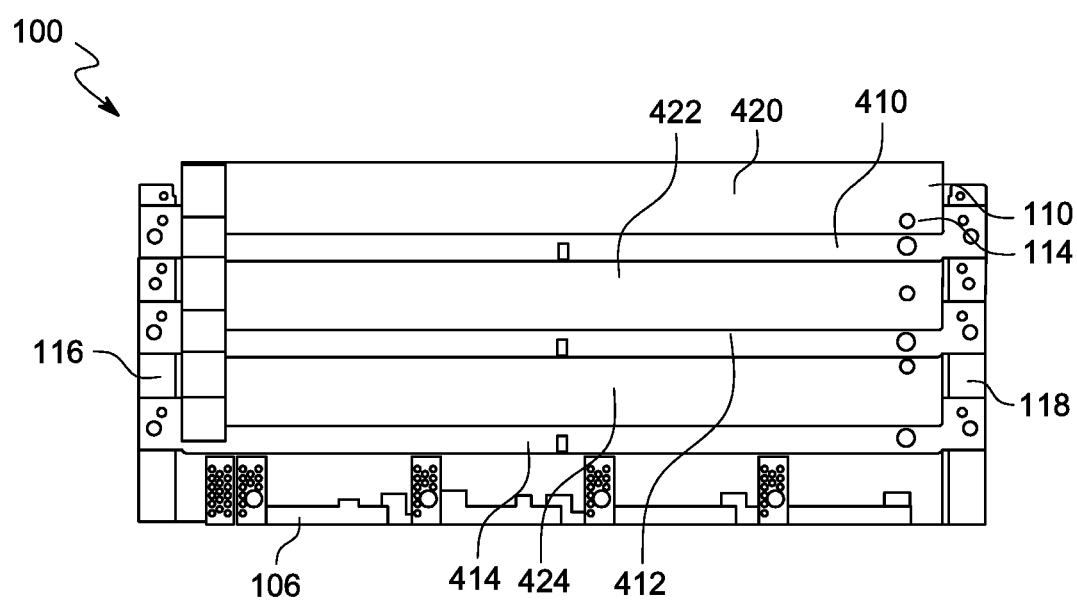
FIG. 4 is a front view of the example adaptable chassis in FIG. 1 with three shelves installed to allow 1.33 U height components to be installed.

FIG. 4 shows an alternate configuration of the chassis 100 to allow different height components than those in FIG. 2. Identical elements in FIG. 4 are labeled with identical element numbers as their counterparts in FIGS. 1-3. The chassis 100 in FIG. 4 has three shelves 410, 412, and 414 installed. Thus, one of the holes on each of the rear ends of the shelves 410, 412, and 414 are inserted into the guide pins 308, 312 and 310 in the row 114 (in FIG. 3). The other hole on each of the rear flanges of the shelves 410, 412, and 414 also mate into the corresponding guide pins in the row 112 (in FIG. 1). Thus, there is a 1.33 standard unit height between the shelves 410, 412 and 414. The shelves 410, 412 and 414 each have forward tabs that are then fastened to the flanges 116 and 118 of the side walls 102 and 104 (in FIG. 1). After the shelves 410, 412, and 414 are secured, electronic component sleds may be installed in the trays of the shelves 410, 412, and 414. In this example, a series of 1.33 unit height electrical component sleds 420, 422, and 426 are inserted on the shelves 410, 412, and 414 respectively.

Figure 5:
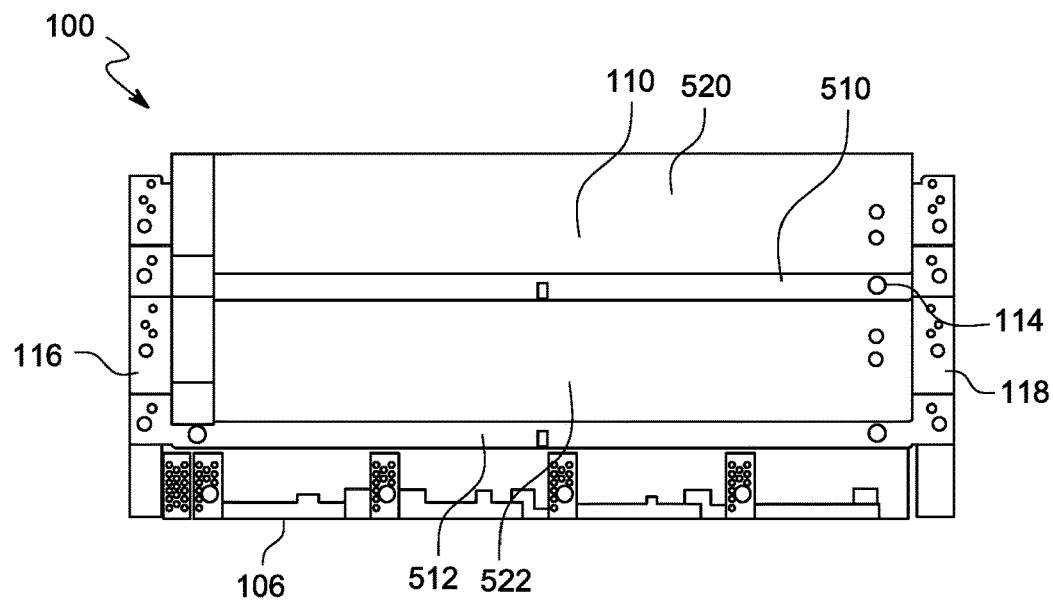
FIG. 5 is a front view of the example adaptable chassis in FIG. 1 with two shelves installed to allow 2 U height components to be installed.

FIG. 5 shows an alternate configuration of the chassis 100 to allow different height component sleds than those in FIG. 2 or FIG. 4. Identical elements in FIG. 5 are labeled with identical element numbers as their counterparts in FIGS. 1-3. The chassis 100 in FIG. 5 has two shelves 510 and 512 installed. One of the holes in the rear ends of the shelves 510 and 512 are inserted onto the guide pins 308 and 312 in the row 114 (in FIG. 3). The other holes of the rear flanges of the shelves 510 and 512 are inserted into the corresponding guide pins in the row 112 (in FIG. 1). Thus, there is a 2-unit standard unit height between the shelves 510 and 512. The shelves 510 and 512 each have forward tabs that are fastened to the flanges 116 and 118 of the side walls 102 and 104. After the shelves 510 and 512 are secured, electronic component sleds may be installed in the shelves 510 and 512. In this example, two 2-unit height electrical component sleds 520 and 522 are inserted on the shelves 510 and 512 respectively.

Figure 6A:
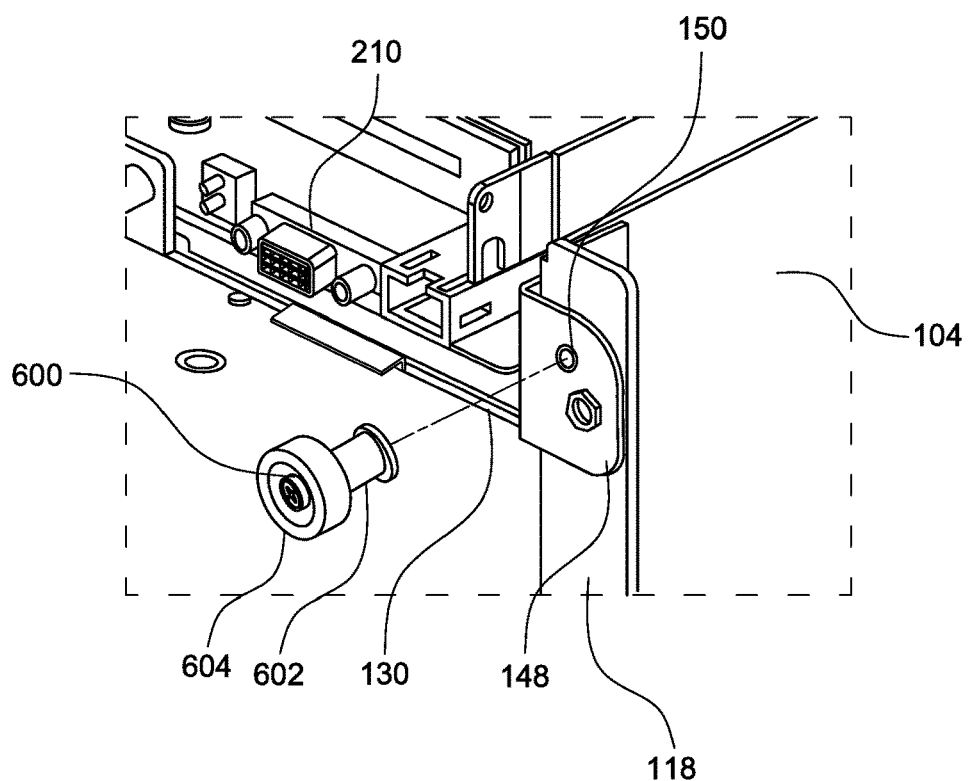
FIGS. 6A-6C are perspective views of different attachment mechanisms for securing the shelves for the adaptable chassis in FIG. 1.
Figure 6B:
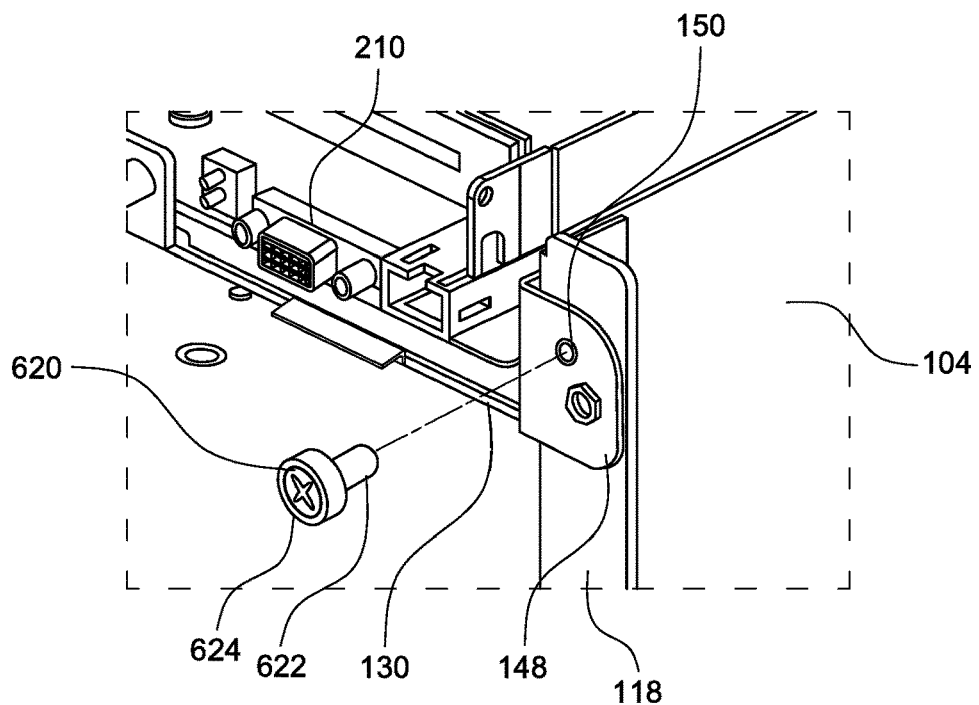
Figure 6C:
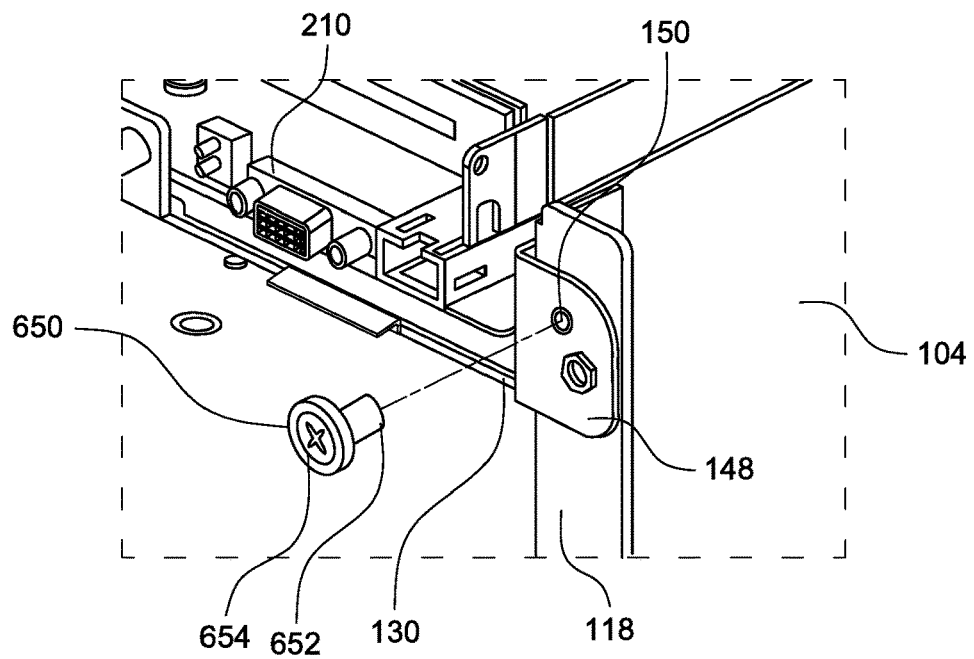

FIGS. 6A-6C show different fasteners that may be used to attach shelves such as the shelves 130, 132, 134 and 136 in FIG. 2. Identical elements in FIGS. 6A-6C are labeled with identical element numbers as their counterparts in FIGS. 1-3. FIG. 6A shows a quarter turn fastener 600 that has a circular body 602 that may be inserted through the guide hole 150 in the tab 148 of the shelf 130. The circular body 602 is then inserted in a hole in the flange 118 of the side wall 104 to join the tab 148 of the shelf 130 to the flange 118. The quarter turn fastener 600 includes a cylindrical head 604 that allows a user to turn the fastener 600 to lock the shelf 132 with the flange 118 of the side wall 104. Once the shelf 130 is secured, the sled 210 may be installed on the shelf 130.

FIG. 6B shows a thumb screw 620 that has a screw head 622 that may be inserted through the guide hole 150 in the tab 148 of the shelf 130. The screw head 622 is then inserted in a hole in the flange 118 of the side wall 104 to join the tab 148 of the shelf 130. The thumb screw 620 includes a cylindrical knob 624 that allows a user to turn and tighten the thumb screw 620 to lock the shelf 132 with the flange 118 of the side wall 104. Once the shelf 130 is secured, the sled 210 may be installed on the shelf 1302.

FIG. 6C shows a regular screw 650 that has a screw head 652 that may be inserted through the guide hole 150 in the tab 148 of the shelf 132. The screw head 652 is inserted in a hole in the flange 118 of the side wall 104 to join the tab 148 of the shelf 130. The regular screw 650 includes a cylindrical head 654 that allows a user to turn and tighten the screw 650 to join the shelf 130 with the flange 118 of the side wall 104. Once the shelf 130 is secured, the sled 210 may be installed on the shelf 130.

Another example of an adaptable chassis 700 is shown in FIGS. 7A-7D that are front views of different configurations of the adaptable chassis 700. The adaptable chassis 700 is similar to the chassis 100 shown in FIGS. 1-6 as it allows the adjustment for different heights between shelves and therefore allows sleds of different heights to be installed. The chassis 700 includes a component area 702 that includes power supply units and other support electronics for swappable electronic devices that may be installed in the chassis 700. The chassis 700 includes two side walls 712 and 714 that are connected by a top plate 716 and a bottom plate 718. The front of the chassis 700 is open while the rear of the chassis 700 is enclosed. A series of shelves may be inserted between the two side walls 712 and 714. In this example, there are three shelves installed in the chassis 700. It is to be understood that different numbers of shelves at different heights may be installed in the chassis 700.

Figure 7A:
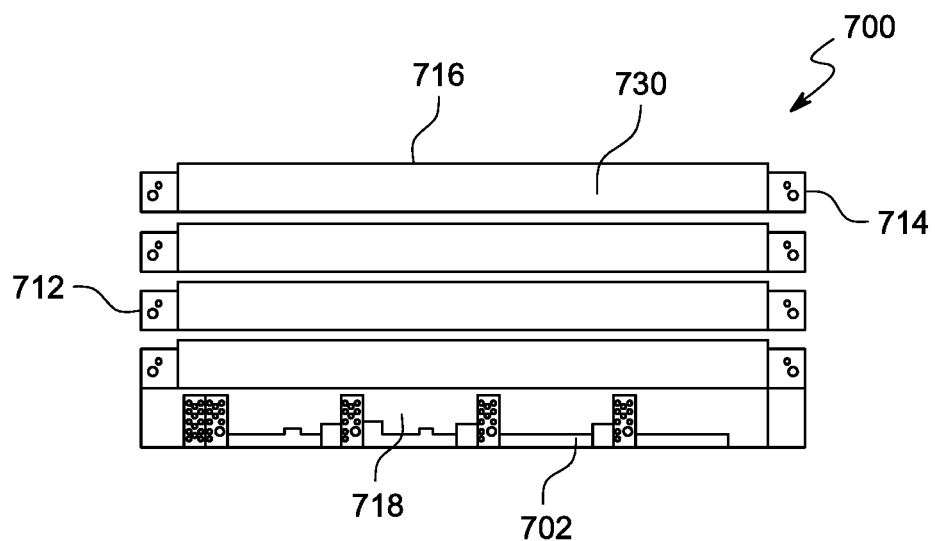
FIGS. 7A-7D are front views of another adaptable chassis having different numbers of sleds based on attachment to a horizontal bus bar.
Figure 7B:
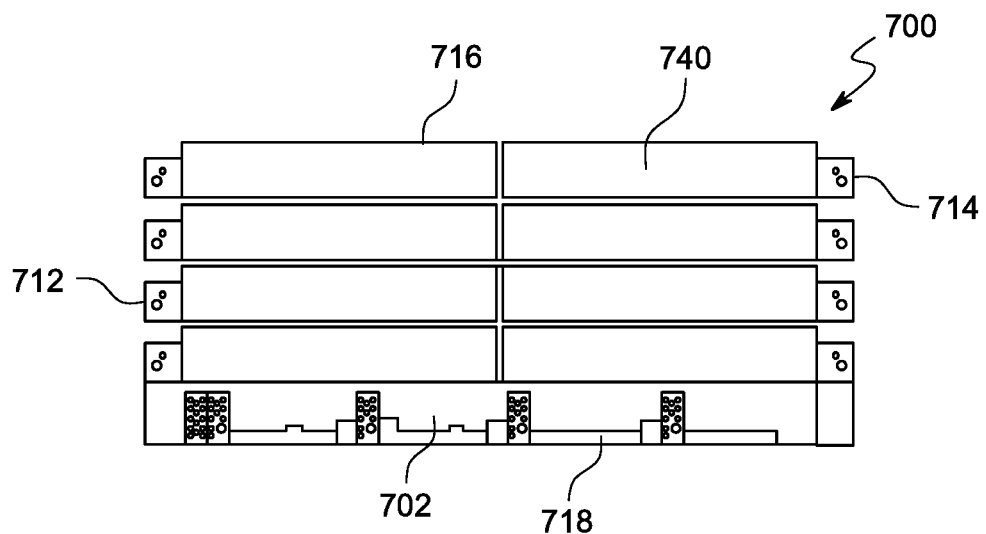
Figure 7C:
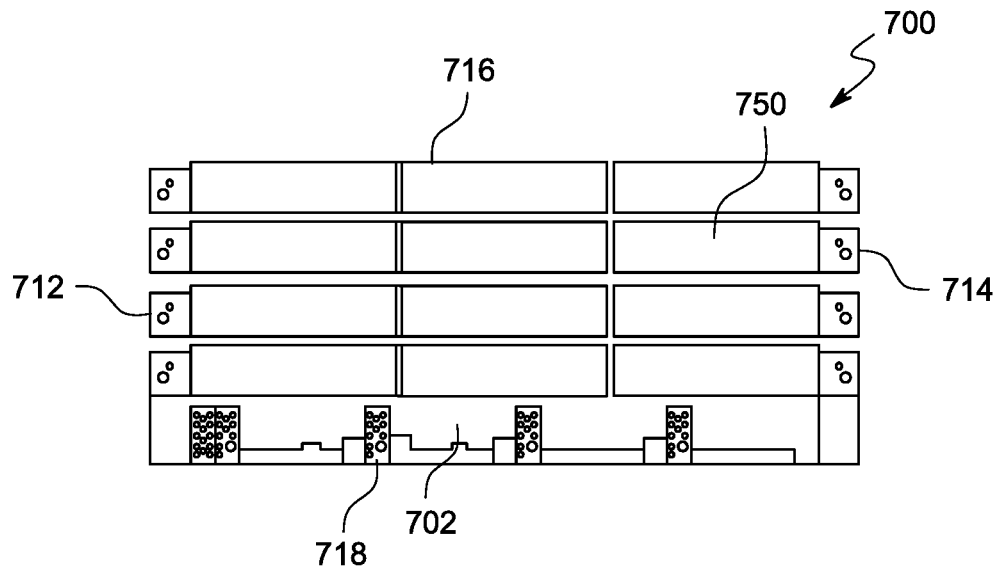
Figure 7D:
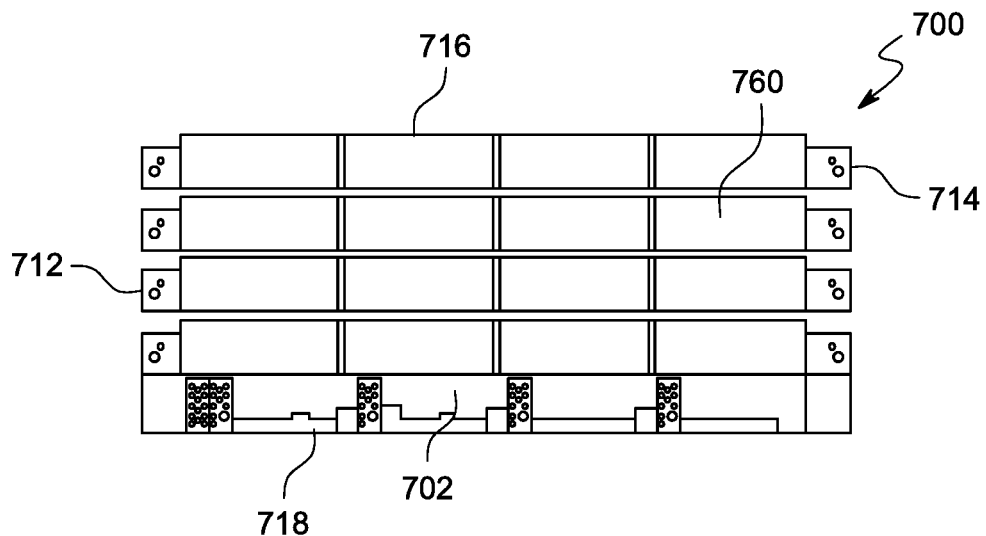

In this example, the adaptable chassis 700 also allows sleds of different widths to be deployed through the use of a horizontal bus bar. Specifically, different width sleds may be installed and connected to the common horizontal bus bar at the back of the chassis 700. FIG. 7A shows the installation of four sleds 730 that have a one unit height and the same width as the chassis 700. FIG. 7B shows the installation of eight sleds 740 in the chassis 700. Each of the sleds 740 has a one unit height but have half the width of the chassis 700. Thus, each of the shelves of the chassis 700 can hold two of the sleds 740, making a total of eight sleds 740. FIG. 7C shows the installation of twelve sleds 750 in the chassis 700. Each of the sleds 750 has a one unit height but have one third of the width of the chassis 700. Thus, each of the shelves of the chassis 700 can hold three of the sleds 750, making a total of twelve sleds 750. FIG. 7D shows the installation of sixteen sleds 760 in the chassis 700. Each of the sleds 760 has a one unit height but have a quarter the width of the chassis 700. Thus, each of the shelves of the chassis 700 can hold four of the sleds 760, making a total of sixteen sleds 760. The use of horizontal bus bars allows mixing of the different width sleds on the shelves. Even though sleds of the same width are shown in FIGS. 7A-7D, different width sleds may be deployed on each shelf, and different width sleds may be deployed on the different shelves.

Figure 8:
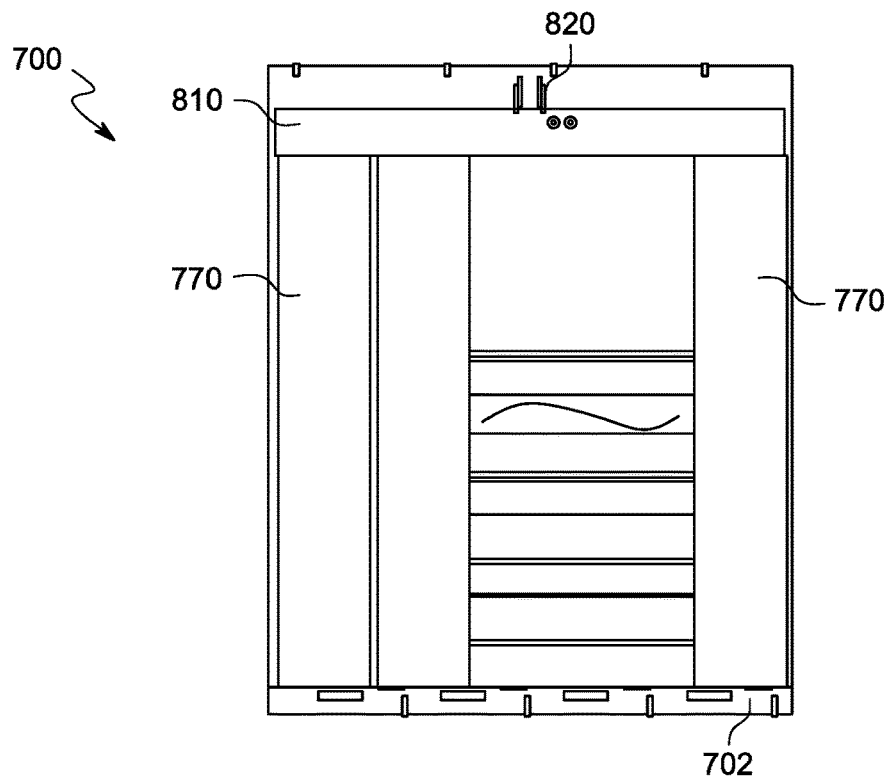
FIG. 8 is a top view of the chassis in FIGS. 7A-7D showing the horizontal bus bar.
Figure 9:
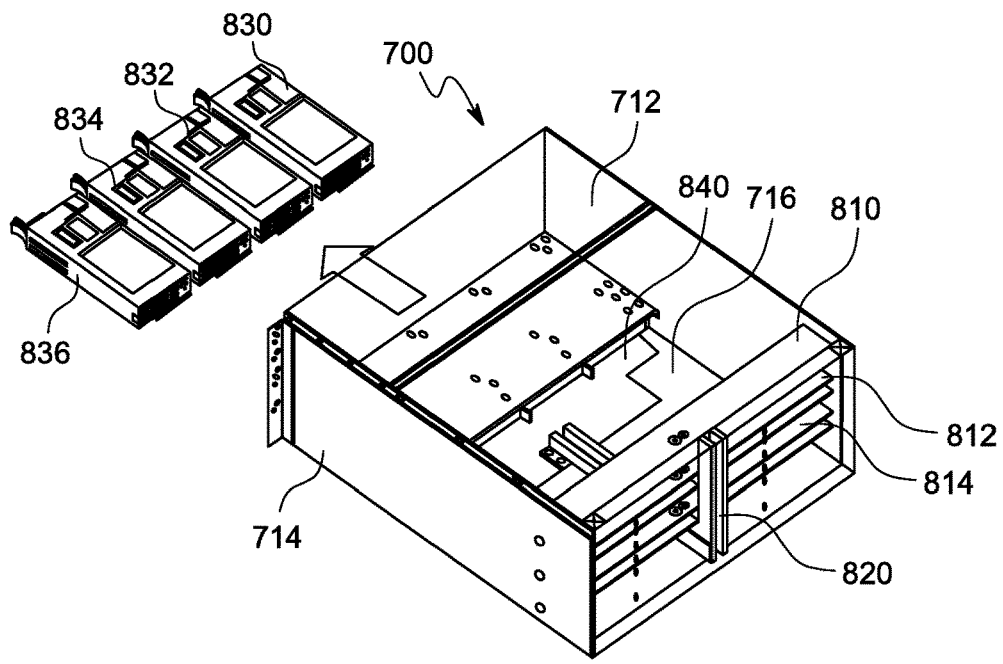
FIG. 9 is a perspective view of the adaptable chassis in FIGS. 7A-7D with horizontal bus bars and different sleds.

FIG. 8 shows a top view of the chassis 700. FIG. 9 shows an exploded perspective view of the chassis 700. Similar elements in FIGS. 8-9 are labeled with identical element numbers as those in FIGS. 7A-7D. In this example, FIG. 8 shows sleds 770 that are inserted in the chassis 700. In this example, up to five sleds 770 may be mounted on each of the four shelves of the example chassis 700. The chassis 700 includes a series of three rear horizontal bus bars 810, 812, and 814 that are mounted on a vertical support 820. Each of the three rear horizontal bus bars 810, 812, and 814 are at the height of one or more of the sleds shown in FIGS. 7A-7D. A fourth horizontal bus bar similar to the bus bars 810, 812, and 814 may be installed on the vertical support 820 to correspond to a fourth row of sleds. The rear horizontal bus bars, such as the horizontal bus bar 810, each support power cables and connectors that carry power to sleds that are installed in the chassis 700. In this example, a series of power supply units 830, 832, 834, and 836 are mounted on a power distribution board 840 that is located in the components area 702 of the chassis 700. As shown in the FIG. 9, the power supply units 830, 832, 834, and 836 are modular and may be swapped out. The power distribution board 840 includes connectors that allow cables to carry power from the power supply units 830, 832, 834, and 836 to electronic components on the sleds mounted on the chassis 700. The vertical support bar 820 is attached to the power distribution board 840.

As shown in FIG. 8, the rear horizontal bus bar 810 allows several sleds 770 to be inserted into the chassis 700. After the sleds 770 are attached to the shelves, power connectors are connected to the sleds 770 to power the electronic components on the sleds 770. Since the rear horizontal bus bar 810 spans the entire width of the chassis 700, sleds of any width may be attached to the rear horizontal bus bar 810. Thus, the horizontal bus bar 810 may provide support for a sled such as the sled 730 (in FIG. 7A) that is the width of the chassis 700; a sled such as the sled 740 (in FIG. 7B) that is half the width of the chassis 700; a sled such as the sled 750 (in FIG. 7C) that is a third of the width of the chassis 700; or a sled such as the sled 760 (in FIG. 7D) that is a fourth of the width of the chassis 700. The front of the shelf may include a similar tab structure to that shown in FIGS. 1-3 to be connected to corresponding flanges of the side walls of the chassis.

Figure 10:
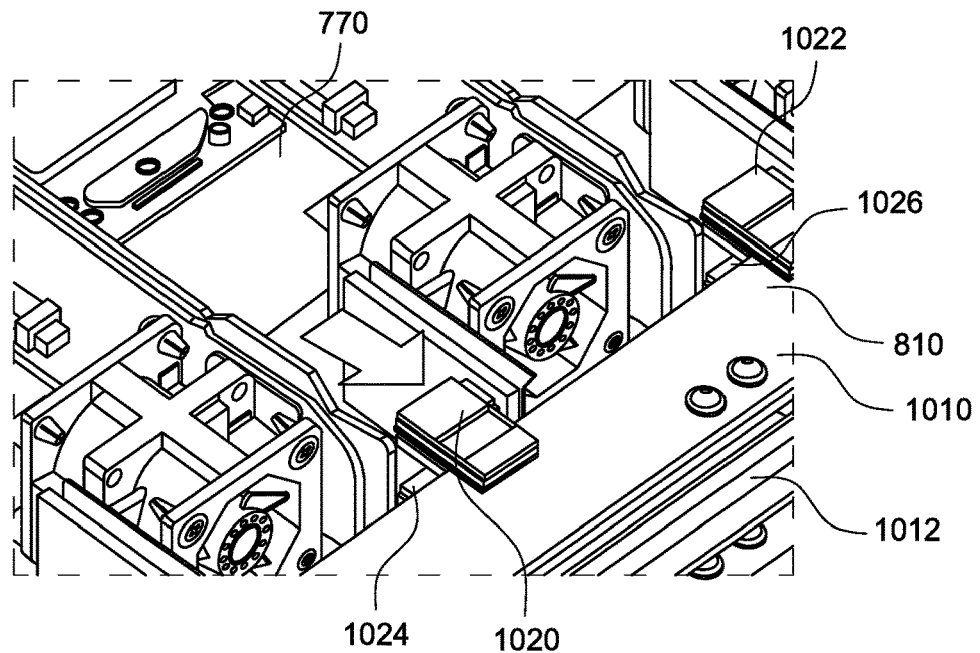
FIG. 10 is a perspective top view of the attachment of a sled with the bus bar in the adaptable chassis in FIGS. 7A-7D.
Figure 11:
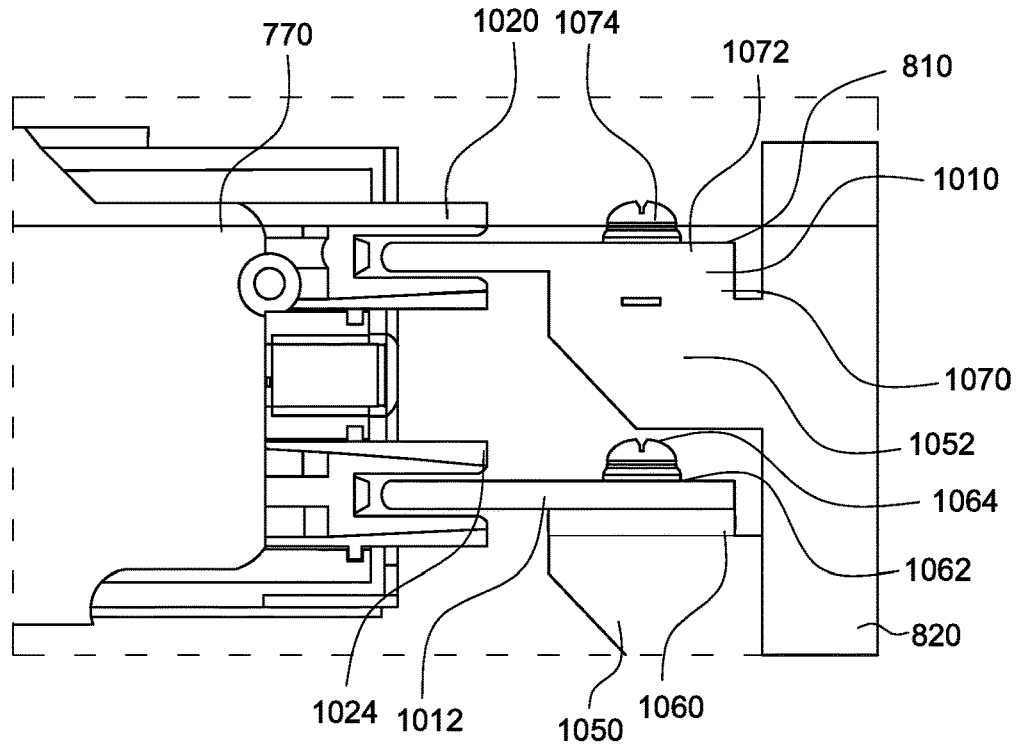
FIG. 11 is a side view of the attachment of one of the sleds in FIG. 9 with the bus bar in the adaptable chassis in FIGS. 7A-7D.

FIG. 10 is a close up perspective view of the sled 770 attached to the rear horizontal bus bar 810 (in FIG. 8). FIG. 11 is a close up side view of the sled 770 attached to the rear horizontal bus bar 810. As may be seen in FIGS. 10-11, each of the horizontal bus bars, such as the horizontal bus bar 810, includes a top bar plate 1010 and a bottom plate 1012. The sled 770 includes two upper clamps 1020 and 1022 that mate with the top bar plate 1010. The sled 770 also includes two bottom clamps 1024 and 1026 that mate with the bottom bar 1012 plate. The clamps 1020 and 1024 are part of the linking board (not shown) that is connected to the sled 770. In this manner, the sled 770 can be provided with power from the bus bar 810.

Figure 12A:
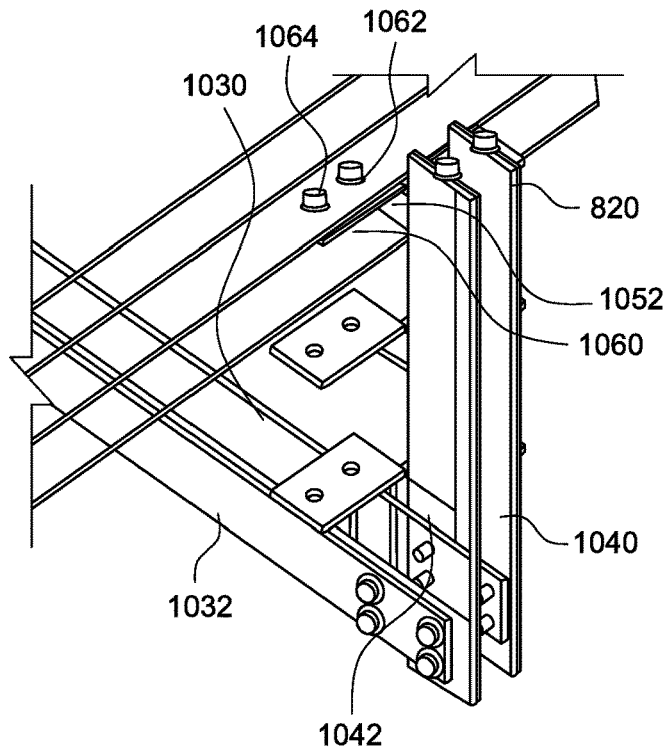
FIG. 12A-12B are perspective views of the horizontal bus bar and vertical support in the chassis in FIGS. 7A-7D.
Figure 12B:
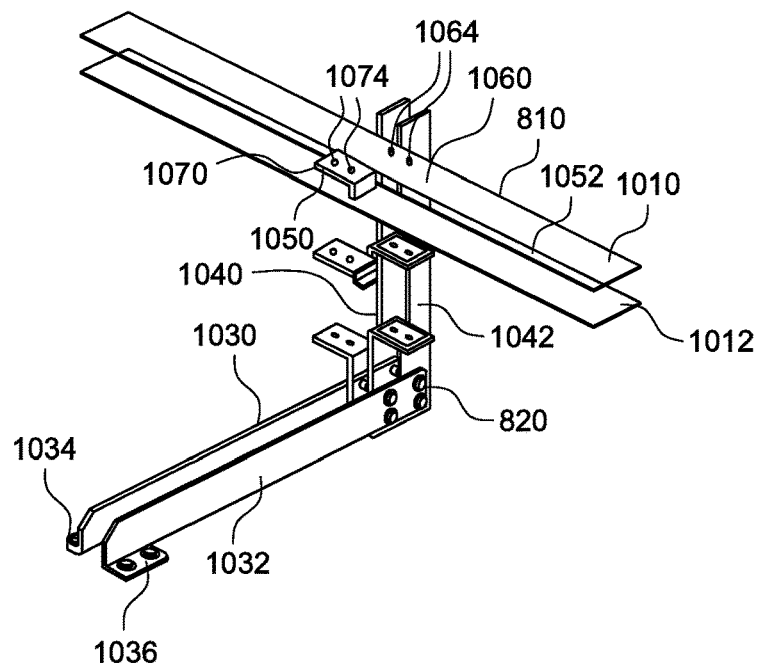

FIGS. 12A and 12B are perspective views of the horizontal bus bar 810 and the support structure 820 in FIG. 8. The support structure 820 includes a pair of anchoring supports 1030 and 1032. The anchoring supports 1030 and 1032 are attached perpendicularly to the support structure 820 and extend into the chassis 700. The anchoring supports 1030 and 1032 include respective anchoring plates 1034 and 1036 at one end. The anchoring plates 1034 and 1036 are attached to the power distribution board 840 (in FIG. 9) via a series of screws. The opposite end of the anchoring supports 1030 and 1032 are attached to one end of respective vertical supports 1040 and 1042 via respective screws. The vertical supports 1040 and 1042 extend over the height of the chassis 700 in order to support horizontal bus bars at any height.

The vertical supports 1040 and 1042 include braces such as braces 1050 and 1052, for each of the horizontal bus bars. In this example, the brace 1050 projects from the vertical support 1040 and the brace 1052 projects from the vertical support 1042. The brace 1052 includes a horizontal support plate 1060 that includes screw holes 1062 that may accommodate screws 1064 as shown in FIG. 11. The bottom bar 1012 includes corresponding screw holes that may be aligned with the screw holes 1062. The support plate 1060 thus is attached to the bottom bar 1012 via the screws 1064. Similarly, the brace 1050 includes a horizontal support plate 1070 that includes screw holes 1072 that may accommodate screws 1074 as shown in FIG. 11. The top bar 1010 includes corresponding screw holes that may be aligned with the screw holes 1072. The support plate 1070 thus is attached to the top bar 1010 via the screws 1074.

Figure 13:
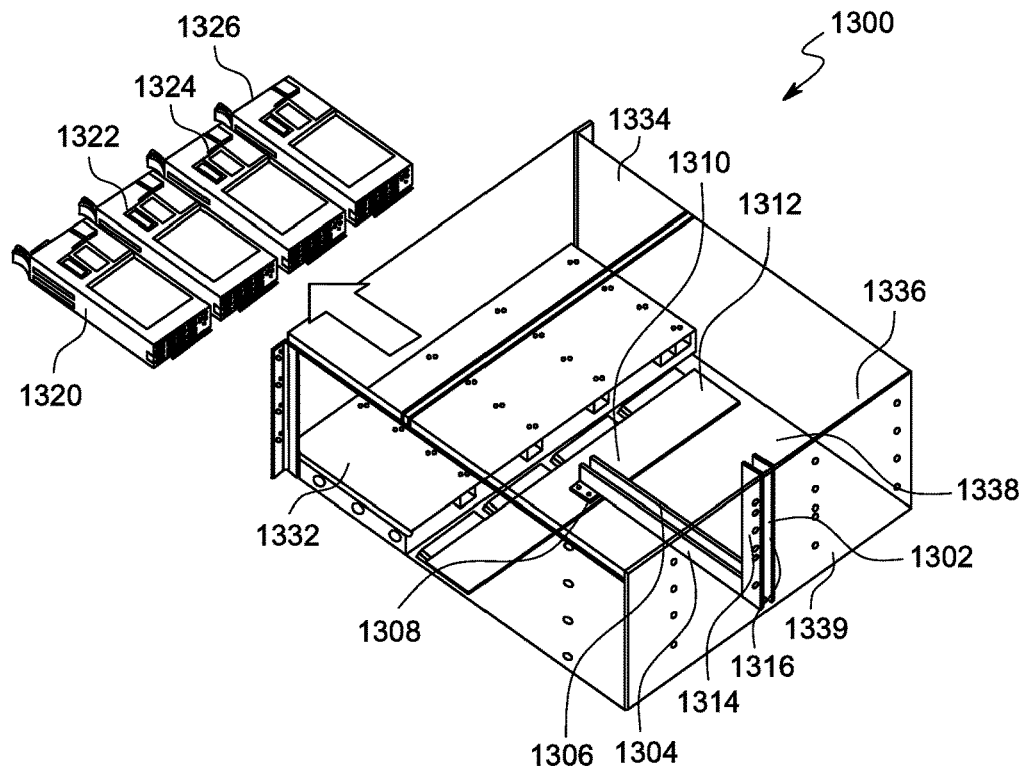
FIG. 13 is a perspective view of another example adaptable chassis with a vertical bus bar.

FIG. 13 is an exploded perspective view of another example chassis 1300 that includes an adjustable vertical bus bar structure 1302. The bus bar structure 1302 includes a pair of anchoring supports 1304 and 1306. The anchoring supports 1304 and 1306 include respective anchoring plates 1308 and 1310 at one end. The anchoring plates 1308 and 1310 are attached to a power distribution board 1312 via a series of screws. The opposite end of the anchoring supports 1304 and 1306 are attached to one end of respective vertical supports 1314 and 1316 via respective screws. The vertical supports 1314 and 1316 extend over the height of the chassis 1300 in order to allow power cables to be connected to sleds at different heights. A series of swappable power supply units 1320, 1322, 1324, and 1326 are supported by the power distribution board 1312.

The chassis 1300 also includes a pair of side walls 1332 and 1334. The side walls 1332 and 1334 are joined to a top wall 1336 and a bottom wall 1338. A back wall 1339 closes off the rear end of the chassis 1300. The front end of the chassis 1300 is open for insertion of electronic component sleds.

Figure 14:
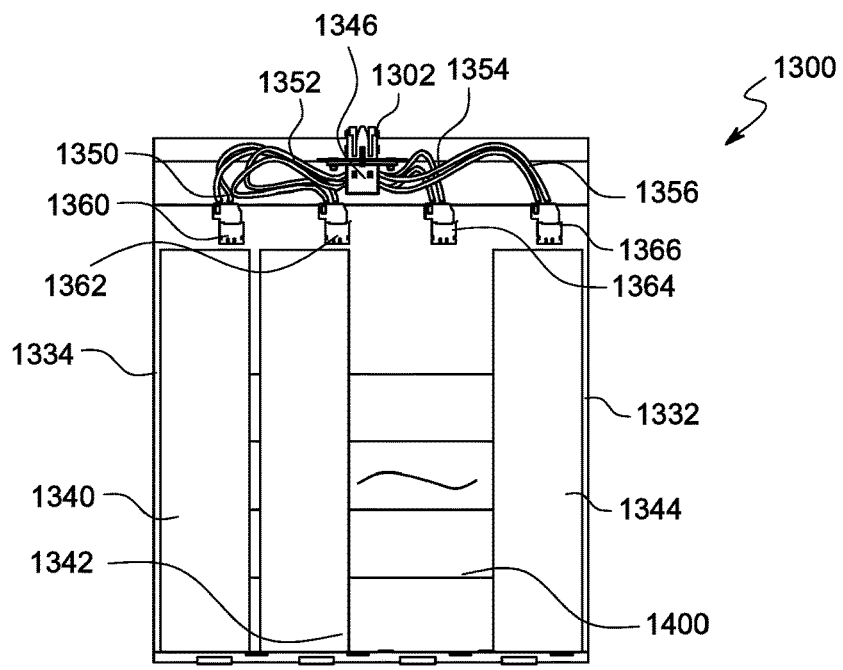
FIG. 14 is a top view of the attachment of power cables to each of the sleds after attachment to the vertical bus bar in the chassis in FIG. 13.

FIG. 14 is a top down view of the chassis 1300. The example chassis 1300 holds four sled slots over the width of the chassis 1300 on a shelf 1400 mounted between the side walls 1332 and 1334 of the chassis 1300. The example chassis 1300 has three shelves installed that are spaced at a height to accommodate 1 U height network devices. Of course, more or less than three sleds may be held by the chassis 1300. Further, different height shelves may be used for the chassis 1300. In this example, FIG. 14 shows the installation of three sleds 1340, 1342, and 1344 on one of the shelves. The bus bar 1302 allows the attachment of a power cable guide 1346 that supports four different sets of power cables 1350, 1352, 1354, and 1356. The power cables 1350, 1352, 1354, and 1356 each have a respective plug 1360, 1362, 1364, and 1366 that may be used to power one of the sleds. In this example, the plugs 1360, 1362, and 1366 are plugged into respective sleds 1340, 1342, and 1344.

Figure 15:
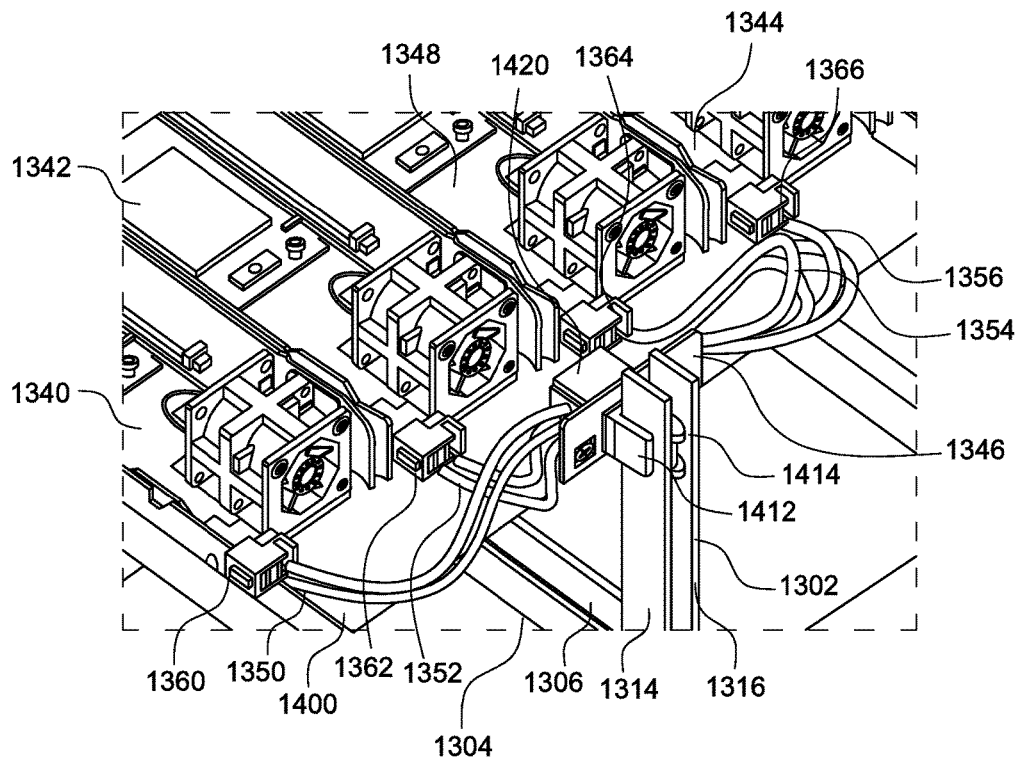
FIG. 15 is a close-up perspective view of sleds being attached to power cables from the vertical bus bar in the chassis in FIG. 13.
Figure 16:
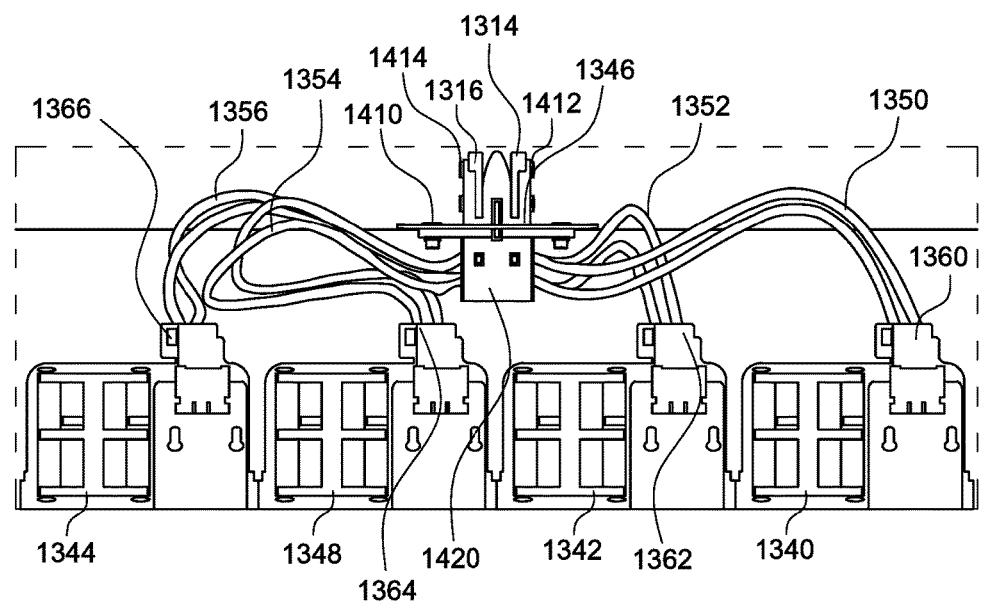
FIG. 16 is a top view of the attachment of power cables to the sleds in the example chassis shown in FIG. 13.

FIG. 15 is a close up perspective view of the vertical bus bar 1302 and the power connections to sleds in the chassis 1300 (in FIGS. 13-14). FIG. 16 is a close up top down view of the vertical bus bar 1302 and the power connection to sleds in the chassis 1300. In FIGS. 15 and 16, a fourth sled 1348 has been inserted in the chassis 1300. As shown in FIGS. 15 and 16, the guide 1346 includes a horizontal plate 1410. One side of the horizontal plate 1410 has a pair of clamps 1412 and 1414. The clamps 1412 and 1414 attach to the vertical supports 1314 and 1316 respectively. The clamps 1412 and 1414 hold the guide 1346 at a certain height relative to the sleds 1340, 1342, 1344, and 1348. The opposite side of the plate 1410 holds a cable port 1420 that includes plugs for the sets of power cables 1350, 1352, 1354 and 1356. The cable port 1420 is connected by another set of power cables (not shown) to one of the power supply units (in FIG. 13).

The vertical bus bar structure 1302 is adjustable along the width of the chassis 1300. For example, the power distribution board 1312 may include different registration features such as holes that allow the attachment of the bus bar structure 1302 at different locations. Further additional bus bar structures similar to the bus bar structure may be attached to the power distribution board 1312.

Figure 17A:
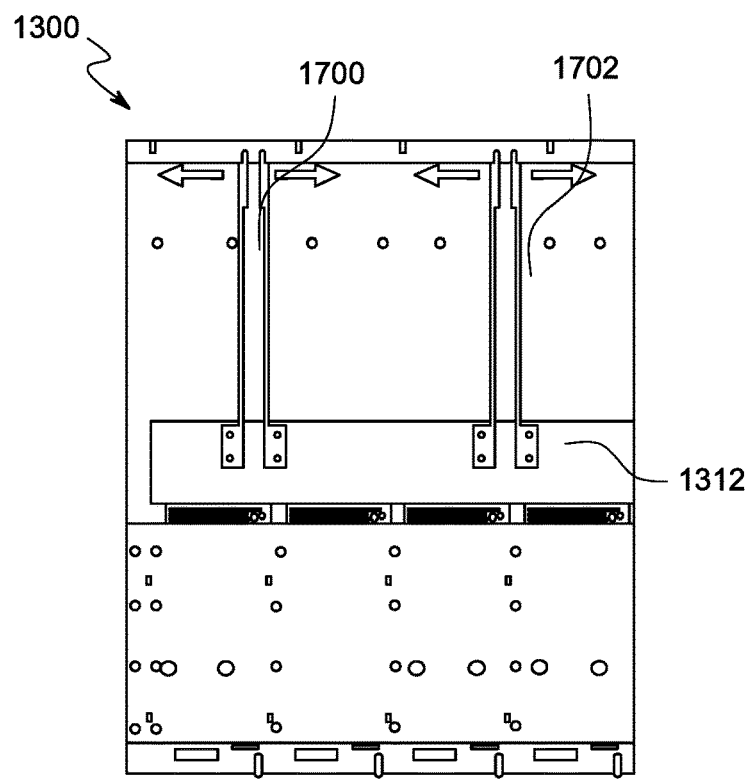
FIG. 17A is a top view of the installation of two vertical bus bars in the chassis in FIG. 13.
Figure 17B:
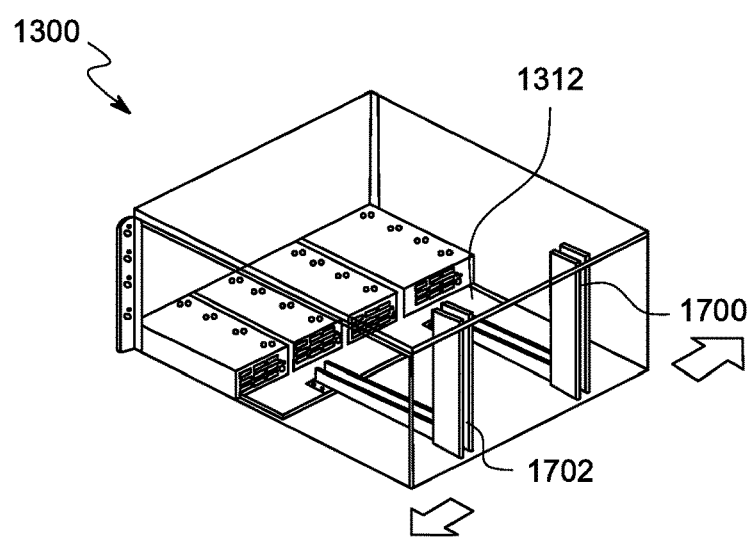
FIG. 17B is a perspective view of the installation of the two vertical bus bars in the chassis in FIG. 13.

An example of additional bus bar structures may be seen in FIGS. 17A-17B. FIG. 17A is a top view of the installation of two vertical bus bars 1700 and 1702 in the chassis 1300 in FIG. 13. FIG. 17B is a perspective view of the installation of the two vertical bus bars 1700 and 1702 on the power distribution board 1312 of the chassis 1300 in FIG. 13. The vertical bus bars 1700 and 1702 are identical to the bus bar structure 1302 shown in FIGS. 13-16. In this example, the vertical bus bars 1700 and 1702 are positioned to provide power cables to a sled or sleds located on the width of the chassis 1300. Thus, multiple power connections may be made through the vertical bus bars 1700 and 1702. The bus bar structures 1700 and 1702 may be adjusted to be located at any position over the width of the chassis 1300.

Figure 18A:
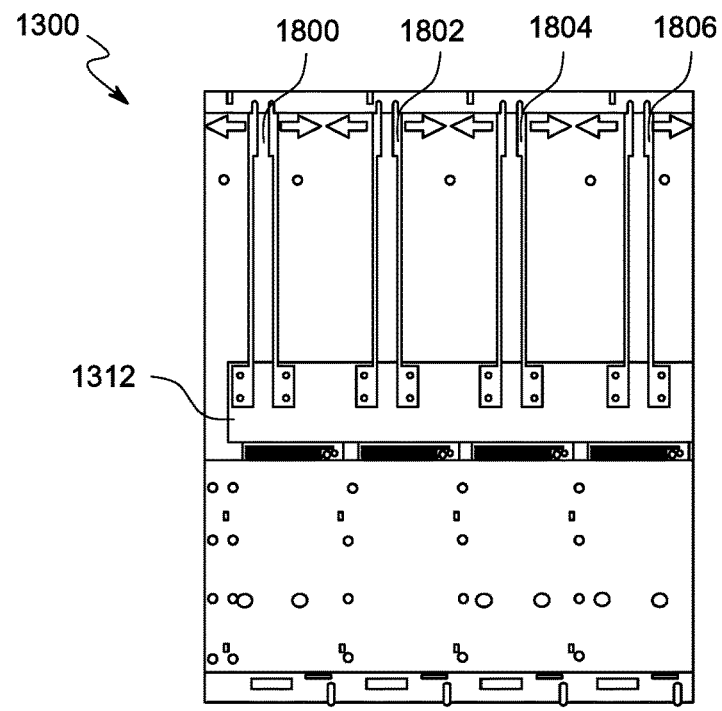
FIG. 18A is a top view of the installation of multiple vertical bus bars in the chassis in FIG. 13.
Figure 18B:
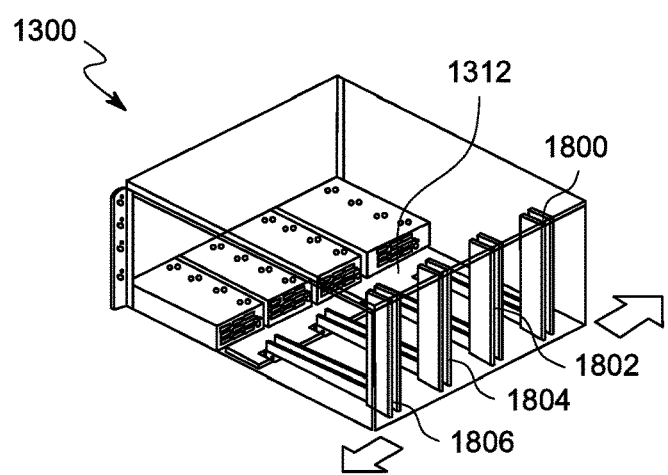
FIG. 18B is a perspective view of the installation of multiple vertical bus bars in the chassis in FIG. 13.

The bus bar structures may also be positioned at different locations as seen in FIGS. 18A-18B. Thus, the power distribution board 1312 may have holes at different positions over the width of the chassis 1300. The holes receive screws attaching the anchor members of the bus bar structures and therefore allow for different numbers of bus bar structures as well as different positioning of the bus bar structures. The positioning of the bus bar structures depends on the types of sled structures that are installed in the chassis 1300. Of course other mechanisms to position the bus bar structures may also be used. FIG. 18A is a top view of the installation of multiple vertical bus bar structures 1800, 1802, 1804, and 1806 in the chassis 1300 in FIG. 13. FIG. 18B is a perspective view of the installation of multiple vertical bus bars 1800, 1802, 1804, and 1806 in the chassis 1300 in FIG. 13. The bus bar structures 1800, 1802, 1804, and 1806 may be adjusted to be located at any position over the width of the chassis 1300.

Figure 19A:
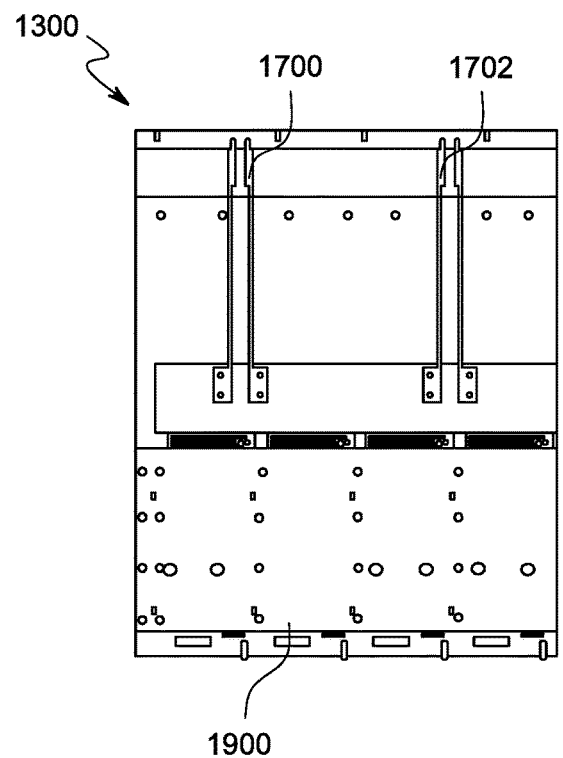
FIGS. 19A-19C are top view of the chassis that show different locations of vertical bus bars and different width sleds.
Figure 19B:
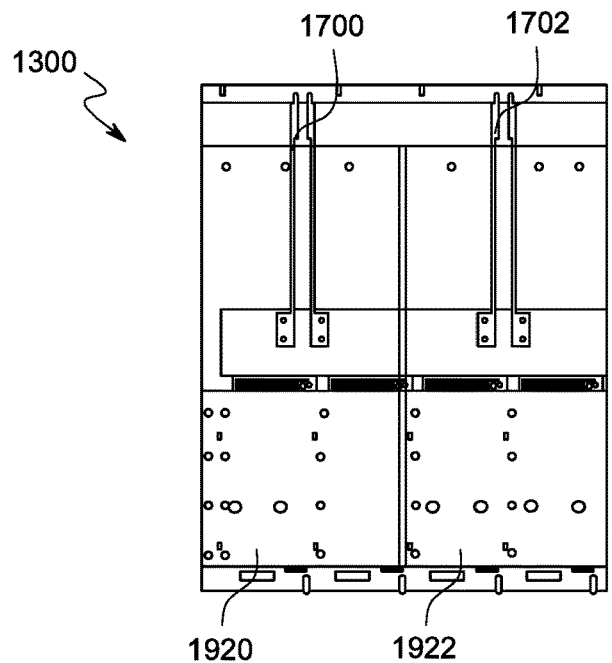
Figure 19C:
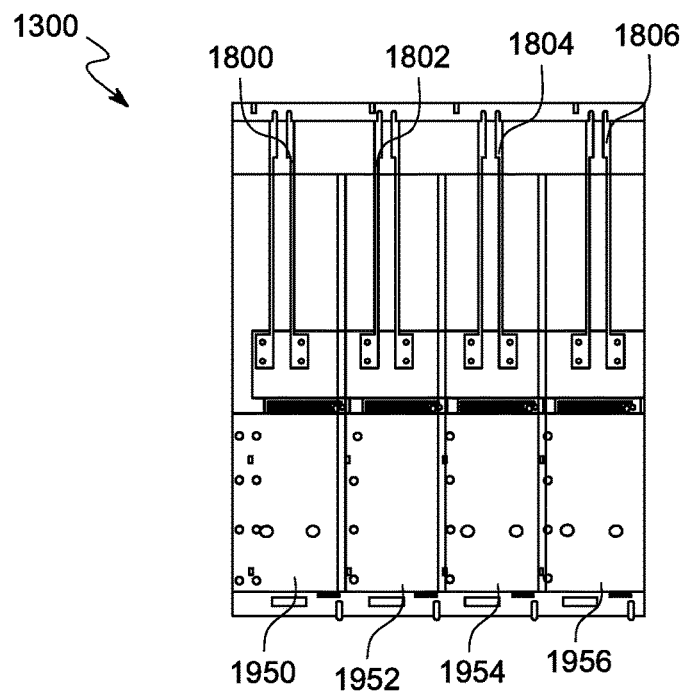

FIGS. 19A-19C are top views of the chassis 1300 in FIG. 13 with different sleds installed in relation to differently located bus bar structures in FIGS. 17-18. FIG. 19A shows the configuration in FIGS. 17A-17B with two vertical bus bars 1700 and 1702. A single sled 1900 is installed in the chassis 1300. The vertical bus bars 1700 and 1702 both support different power connections to the sled 1900.

FIG. 19B shows the configuration in FIGS. 17A-17B with the two vertical bus bars 1700 and 1702. FIG. 19B shows two sleds 1920 and 1922 that are installed in the chassis 1300. As may be seen in FIG. 19B, the sled 1920 is in proximity to the vertical bus bar 1700 and the sled 1922 is in proximity to the vertical bus bar 1702. Thus, the bus bar 1700 provides a support for a power connection to the sled 1920 while the bus bar 1702 provides a support for a power connection to the sled 1922.

FIG. 19C shows the configuration in FIGS. 18A-18B with the four vertical bus bars 1800, 1802, 1804, and 1806. FIG. 19C shows four sleds 1950, 1952, 1954, and 1956 that are installed in the chassis 1300. As may be seen in FIG. 19C, the sled 1950 is in proximity to the vertical bus bar 1800, the sled 1952 is in proximity to the vertical bus bar 1802, the sled 1954 is in proximity to the vertical bus bar 1804, and the sled 1956 is in proximity to the vertical bus bar 1806. Thus, the bus bars 1800, 1802, 1804, and 1806 provides a support for a power connection to the respective sleds 1950, 1952, 1954, and 1956.

Figure 20:
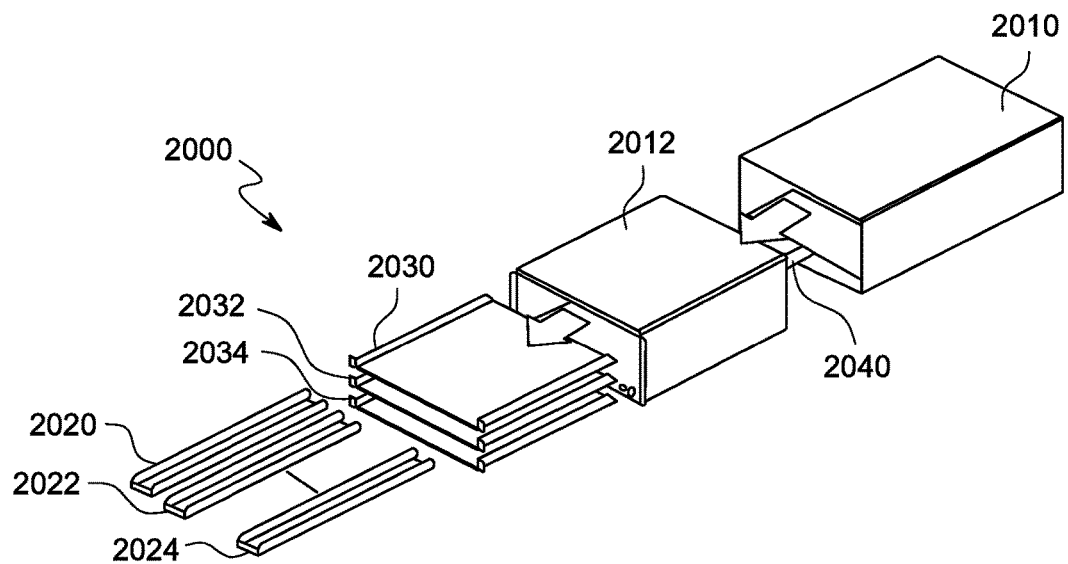
FIG. 20 is a perspective view of an example adaptable chassis that has a front and a rear detachable chassis.
Figure 21:
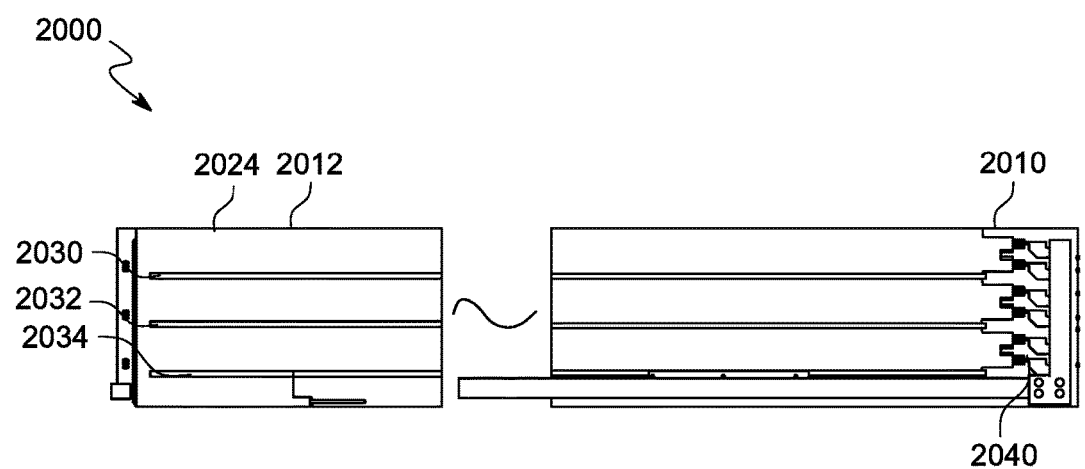
FIG. 21 is a side view of the partially assembled components of the adaptable chassis in FIG. 20.

FIG. 20 is an exploded perspective view of another example of an adaptable chassis structure 2000. FIG. 21 is a side view of the components of the adaptable chassis structure 2000. The adaptable chassis structure 2000 includes a rear chassis 2010 and a front chassis 2012. The chassis 2000 holds a variable number of sleds such as sleds 2020, 2022 and 2024 in a variable number of shelves 2030, 2032, and 2034. Each of the shelves such as the shelf 2030 can hold four sleds having a width such as the width of the sled 2020. Of course other sleds of different widths may be held by each of the shelves 2030, 2032, and 2034. The front chassis 2012 includes different mechanisms to install different numbers of shelves at different heights. An example of such adaptable mechanisms are explained in reference to FIGS. 1-6 above. Further, the rear chassis 2010 allows the installation of different types of bus bars in different locations similar to the configurations described above in reference to FIGS. 13-19. In this example, the rear chassis 2010 has a single vertical bus bar 2040 that may be used to support power cables for the sleds in the front chassis 2012.

As shown in FIGS. 20 and 21, the front chassis 2012 has two side walls and a bottom wall and a top wall that may be slidably engaged with the rear chassis 2010. Thus the front chassis 2012 will be inserted into the rear chassis 2010. In this manner, the front chassis 2012 may hold electronic components such as power supply units on a power distribution boards for connection to network devices that may be inserted on the sleds that are in turn attached to the shelves 2030, 2032, and 2034 in the front chassis 2012. If components need to be serviced in the rear chassis 2010, the front chassis 2012 may be moved away from the rear chassis 2010 to allow access. Further, the types of bus bars may be adjusted in the rear chassis 2010 to accommodate different types of sleds. The front chassis 2012 may be adapted to different heights of shelves that may hold different width sleds. The rear chassis 2010 may have variable lengths to allow the accommodation of a longer sled. Such longer sleds allow the inclusion of additional electronic components such as storage devices. The electronic components such as the power distribution board and power supply units are fixed on the front chassis 2012, while the bus bar is fixed on the rear chassis 2010. The rear chassis 2010 is docked on the front chassis 2012 and screws may be used to attach them together.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. An adaptable chassis, comprising:
   a pair of side walls, each of the side walls having a flange on a front end and an opposite rear end;
   a back wall attached to the rear ends of the side walls, the back wall including a plurality of registration features at different heights;
   a plurality of movable shelves, each of the plurality of removable shelves having a front end and a back end, the back end including an engagement feature that engages one of the plurality of registration features at a desired height, the front end including a tab for contacting the flange of one of the side walls, wherein the flange includes a plurality of holes each corresponding to the plurality of registration features, and wherein the tab of each of the plurality of movable shelves includes a hole; and
   an attachment mechanism inserted in one of the plurality of holes in the flange and the hole of the tab,
   wherein the attachment mechanism is one of a quarter turn fastener, a thumb screw, or a screw.

2. The adaptable chassis of claim 1, further comprising a power distribution board.

3. The adaptable chassis of claim 1, wherein the plurality of registration features includes guide pins extending from the back wall.

4. The adaptable chassis of claim 3, wherein the engagement feature is a hole on the back end that mates with the guide pins.

5. The adaptable chassis of claim 1, wherein each of the plurality of removable shelves is tool-lessly attached to the pair of side walls.

6. The adaptable chassis of claim 1, further comprising an electronic component sled supported by at least one of the plurality of removable shelves.

7. An adaptable chassis comprising:
   a pair of side walls;
   a bottom plate joining the side walls;
   a first shelf inserted between the side walls;
   a bus bar structure located on one end of the side walls, the bus bar structure including a vertical support holding a first horizontal bus bar plate at approximately the same height as the first shelf, wherein the bus bar structure comprises a horizontal anchoring support, wherein the horizontal anchoring support comprises an anchoring plate on a first end, and the horizontal anchoring support is attached to the vertical supports on an opposite end of the first end, wherein the vertical support extends over the height of the adaptable chassis to enable power cables to be connected to sleds at different heights.

8. The adaptable chassis of claim 7, further comprising a power distribution board including power supply units mounted on the bottom plate.

9. The adaptable chassis of claim 8, wherein the bus bar structure includes a base support attached to the vertical support, the base support including an anchor member attached to the power distribution board.

10. The adaptable chassis of claim 7, wherein the shelf is operable to support electronic component sleds of different widths.

11. The adaptable chassis of claim 10, wherein the electronic component sleds include a clamp that engages the first horizontal bus bar plate.

12. The adaptable chassis of claim 7, further comprising a second shelf mounted between the two side walls at a different height than the first shelf, and wherein the bus bar structure includes a second horizontal bus bar plate supported by the vertical support at approximately the same height of the second shelf.

13. An adaptable chassis comprising:
   a pair of side walls each having a front end and a rear end;
   a bottom plate joining the side walls between the front end and the rear end of the side walls;
   a first shelf inserted between the side walls from the front ends of the side walls;

a first bus bar structure located near the rear ends of the side walls, the first bus bar structure including a horizontal anchoring support and a vertical support, the first bus bar structure being adjustably positioned between the side walls, wherein the horizontal anchoring support includes an anchoring plate on a first end, and the horizontal anchoring support is attached to the vertical supports on an opposite end of the first end, wherein the vertical support extends over the height of the adaptable chassis to enable power cables to be connected to sleds at different heights.

14. The adaptable chassis of claim 13, further comprising a second bus bar structure adjustably located near the rear ends of the side walls, the second bus bar structure including a horizontal anchoring support and a vertical support, the second bus bar structure being adjustably positioned between the side walls at a different position than the first bus bar structure.

15. The adaptable chassis of claim 13, further comprising a back wall connected to the rear ends of the side walls.

16. The adaptable chassis of claim 13, further comprising a power distribution board having a power supply unit, the power distribution board mounted on the bottom plate.

17. The adaptable chassis of claim 16, wherein the horizontal anchoring support is anchored to the power distribution board.

18. The adaptable chassis of claim 13, further comprising an electronic component sled mounted on the first shelf in proximity to the bus bar structure.

19. An adaptable chassis comprising:
a front chassis structure having a pair of side walls;
a first shelf insertable between the side walls of the front chassis;
a rear chassis structure having a pair of side walls and an open front end to receive the front chassis; and
a bus bar structure at an opposite rear end of the rear chassis, wherein the bus bar structure comprises a horizontal anchoring support and a vertical support, wherein the horizontal anchoring support includes an anchoring plate on a first end, and the horizontal anchoring support is attached to the vertical supports on an opposite end of the first end, wherein the vertical support extends over the height of the adaptable chassis to enable power cables to be connected to sleds at different heights.

20. The adaptable chassis of claim 19, further comprising an electronic component sled insertable on the first shelf, the electronic component sled being connected to the bus bar structure.

* * * * *